(12) United States Patent
Dunn et al.

(10) Patent No.: US 9,245,694 B2
(45) Date of Patent: Jan. 26, 2016

(54) SOLID-STATE SUPERCAPACITOR (75) Inventors: Bruce S. Dunn, Los Angeles, CA (US); Chi On Chui, Encino, CA (US); Ajey Poovannummoottil Jacob, Albany, NY (US); Daniel Membreno, Los Angeles, CA (US); Leland Smith, Los Angeles, CA (US)

(73) Assignees: The Regents of the University of California, Oakland, CA (US); Intel Corporation, Chandler, AZ (US)

( * ) Notice: Subject to any disclaimer, the term of this patent is extended or adjusted under 35 U.S.C. 154(b) by 463 days.

(21) Appl. No.: 13/470,776

(22) Filed: May 14, 2012

(65) Prior Publication Data

US 2014/0035098 A1 Feb. 6, 2014

Related U.S. Application Data (60) Provisional application No. 61/485,264, filed on May 12, 2011.

(51) Int. Cl.
*H01G 9/00* (2006.01)
*H01G 11/56* (2013.01)
*H01G 11/58* (2013.01)
*H01G 11/84* (2013.01)
*H01L 49/02* (2006.01)
*H01G 11/36* (2013.01)

(52) U.S. Cl.
CPC ............... *H01G 11/56* (2013.01); *H01G 11/58* (2013.01); *H01G 11/84* (2013.01); *H01L 28/40* (2013.01); *H01G 11/36* (2013.01); *H01L 28/60* (2013.01); *Y02E 60/13* (2013.01); *Y10T 29/417* (2015.01)

(58) Field of Classification Search
USPC ......... 361/502, 503–504, 512, 516, 517, 519, 361/523–525, 528, 529, 530
See application file for complete search history.

(56) References Cited

U.S. PATENT DOCUMENTS

| | | | | |
|---|---|---|---|---|
| 5,079,674 A | * | 1/1992 | Malaspina | 361/502 |
| 6,187,061 B1 | * | 2/2001 | Amatucci et al. | 29/25.03 |
| 7,061,749 B2 | * | 6/2006 | Liu et al. | 361/502 |
| 7,145,233 B2 | * | 12/2006 | Vinson et al. | 257/724 |
| 7,622,422 B2 | * | 11/2009 | Vioux et al. | 502/405 |
| 7,903,390 B2 | * | 3/2011 | Fan | 361/502 |
| 7,948,739 B2 | * | 5/2011 | Zhamu et al. | 361/523 |
| 8,373,971 B2 | * | 2/2013 | Young | 361/502 |
| 2010/0178568 A1 | * | 7/2010 | Unalan et al. | 429/317 |
| 2012/0021279 A1 | * | 1/2012 | Le Bideau et al. | 429/189 |

OTHER PUBLICATIONS

Gupta, AK, et al., "Low density ionogels obtained by rapid gellification of tetraethyl orthosilane assisted by ionic liquids," Dalton Transactions, 2012, vol. 41, pp. 6263-6271, RSC Publishing.

Neouze, MA et al., "Ionogels, New Materials Arising from the Confinement of Ionic Liquids within Silica-Derived Networks," Chem. Mater, 2006, vol. 18, No. 17, pp. 3931-3936, American Chemical Society.

* cited by examiner

*Primary Examiner* — Nguyen T Ha
(74) *Attorney, Agent, or Firm* — Withrow & Terranova, P.L.L.C.

(57) ABSTRACT

Embodiments of the present disclosure relate to a solid-state supercapacitor. The solid-state supercapacitor includes a first electrode, a second electrode, and a solid-state ionogel structure between the first electrode and the second electrode. The solid-state ionogel structure prevents direct electrical contact between the first electrode and the second electrode. Further, the solid-state ionogel structure substantially fills voids inside the first electrode and the second electrode.

19 Claims, 10 Drawing Sheets

SOLID-STATE SUPERCAPACITOR

RELATED APPLICATIONS

This application claims the benefit of U.S. provisional patent application No. 61/485,264, filed May 12, 2011, the disclosure of which is incorporated herein by reference in its entirety.

GOVERNMENT SUPPORT

This invention was made with Government support under HR0011-10-3-0002, awarded by the Defense Advanced Research Projects Agency. The Government has certain rights in the invention.

FIELD OF THE DISCLOSURE

The present disclosure relates to supercapacitors and integrated circuitry, which may include supercapacitors.

BACKGROUND

A traditional capacitor, such as an electrostatic capacitor, has a capacitance, which is based on an area of two electrostatic plates and a separating distance between the electrostatic plates. Such a capacitor has a dry separator between the plates. However, a supercapacitor is an electrochemical capacitor, which is an electrochemical energy storage device instead of an electrostatic energy storage device. In a typical supercapacitor, an electric charge is stored in an electrical double layer formed at an interface between an electrode and electrolyte solution, which is a liquid. A supercapacitor may include a pair of electrodes, which are separated by a porous separator. The electrodes and the porous separator are immersed in the electrolyte solution. The porous separator, filled with the electrolyte solution, is used to physically isolate the electrodes and prevent electrical shorting of the electrodes. The electrodes may include highly porous carbon particles, which may provide a very high surface area. As a result, a capacitance of a supercapacitor may be large compared to the capacitance of the traditional capacitor. Specific energy is defined as energy per unit mass. The energy stored in a capacitor is directly related to its capacitance and its voltage. Although a maximum operating voltage of a supercapacitor may be on the order of about one volt, the large capacitance may enable the supercapacitor to have a relatively high specific energy.

Response times of supercapacitors tend to be relatively slow. For example, response times may be on the order of hundreds of milliseconds to seconds. As such, supercapacitors may be used in applications that don't require fast response times. For example, such applications may use supercapacitors for energy storage. Integrated circuitry may include a supercapacitor to provide power for certain circuits, such as providing operational power or back-up power for memory circuits, computer circuits, digital circuits, analog circuits, the like, or any combination thereof. Such integrated circuitry may be used in portable equipment, which may need to be small, rugged, light weight, and function in harsh environmental conditions. Preventing leakage of the supercapacitor's liquid electrolyte solution in a portable device may be challenging. Also, exposure of the liquid electrolyte solution to moisture in air may damage the supercapacitor. Therefore, fabrication of the supercapacitor may have special manufacturing needs, thereby preventing integration of supercapacitors into standard manufacturing processes. Further, to keep the supercapacitor small and light weight, a high specific energy is needed. Thus, there is a need for a mechanically durable supercapacitor, which can be fabricated using standard manufacturing processes and has high specific energy.

SUMMARY

Embodiments of the present disclosure relate to a solid-state supercapacitor. The solid-state supercapacitor includes a first electrode, a second electrode, and a solid-state ionogel structure between the first electrode and the second electrode. The solid-state ionogel structure prevents direct electrical contact between the first electrode and the second electrode. Further, the solid-state ionogel structure substantially fills voids inside the first electrode and the second electrode.

In one embodiment of the solid-state supercapacitor, ionogel is an encapsulated ionic liquid electrolyte and the solid-state ionogel structure includes an ionic liquid electrolyte and a functionalized matrix, such that the ionic liquid electrolyte is encapsulated into the functionalized matrix. The solid-state ionogel structure has physical properties similar to other solid structures, which provide mechanical strength and durability. As such, the solid-state supercapacitor is mechanically durable. The ionogel has electrochemical properties similar to an ionic liquid electrolyte. Further, the first and the second electrodes have high surface areas and since the solid-state ionogel structure substantially fills voids inside the first and the second electrodes, the solid-state supercapacitor has high capacitance. Additionally, a maximum operating voltage of the solid-state supercapacitor may be greater than about two volts, whereas a traditional supercapacitor may have a maximum operating voltage on the order of one volt. Therefore, the solid-state supercapacitor has high specific energy.

In one embodiment of the solid-state supercapacitor, the first and the second electrodes each include a conductive supporting structure and a conductive nano-structure, which is attached to the conductive supporting structure. The solid-state ionogel structure substantially fills voids in the first and the second conductive nano-structures. Further, in one embodiment of the solid-state supercapacitor, each of the first and the second conductive supporting structures is a metallic sheet, which is about planar. Each of the first and the second conductive nano-structures is an array of conductive quasi-one-dimensional nanostructures, such that each conductive quasi-one-dimensional nanostructure extends from a surface of the respective conductive supporting structure.

In one embodiment of the solid-state supercapacitor, the solid phase of the functionalized matrix provides considerable moisture resistance. Since a typical micro-electronics manufacturing environment exposes devices under fabrication to ambient air, which has moisture, the solid-state supercapacitor may be integrated into a typical micro-electronics fabrication environment without being damaged by the moisture in the ambient air. As such, the solid-state supercapacitor may be integrated into a semiconductor die, thereby reducing manufacturing costs, product size, and the like.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

Embodiments of the present disclosure relate to a solid-state supercapacitor. The solid-state supercapacitor includes a first electrode, a second electrode, and a solid-state ionogel structure between the first electrode and the second electrode. The solid-state ionogel structure prevents direct electrical contact between the first electrode and the second electrode. Further, the solid-state ionogel structure substantially fills voids inside the first electrode and the second electrode.

Figure 1:
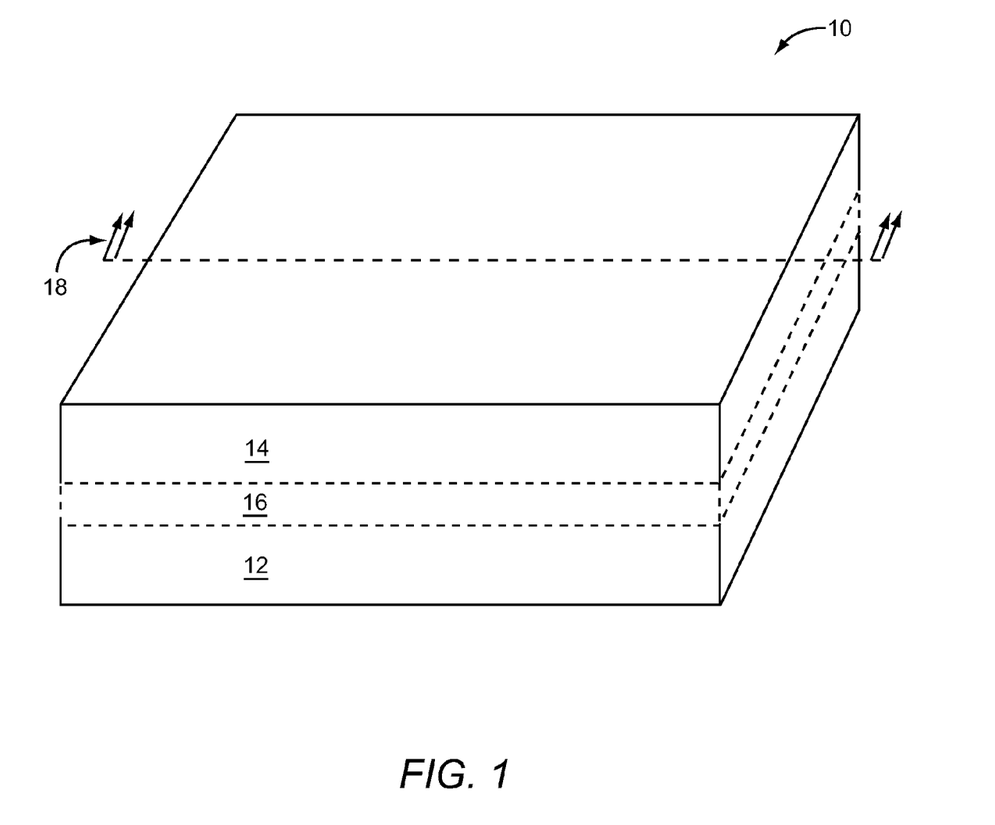
FIG. 1 shows a solid-state supercapacitor according to one embodiment of the solid-state supercapacitor.

FIG. 1 shows a solid-state supercapacitor 10 according to one embodiment of the solid-state supercapacitor 10. The solid-state supercapacitor 10 includes a first electrode 12, a second electrode 14, and a solid-state ionogel structure 16 between the first electrode 12 and the second electrode 14. The solid-state ionogel structure 16 prevents direct electrical contact between the solid-state supercapacitor 10 and the second electrode 14. Further, the solid-state ionogel structure 16 substantially fills voids inside the first electrode 12 and the second electrode 14. The solid-state supercapacitor 10 illustrated in FIG. 1 has a cross-section 18.

Figure 2:
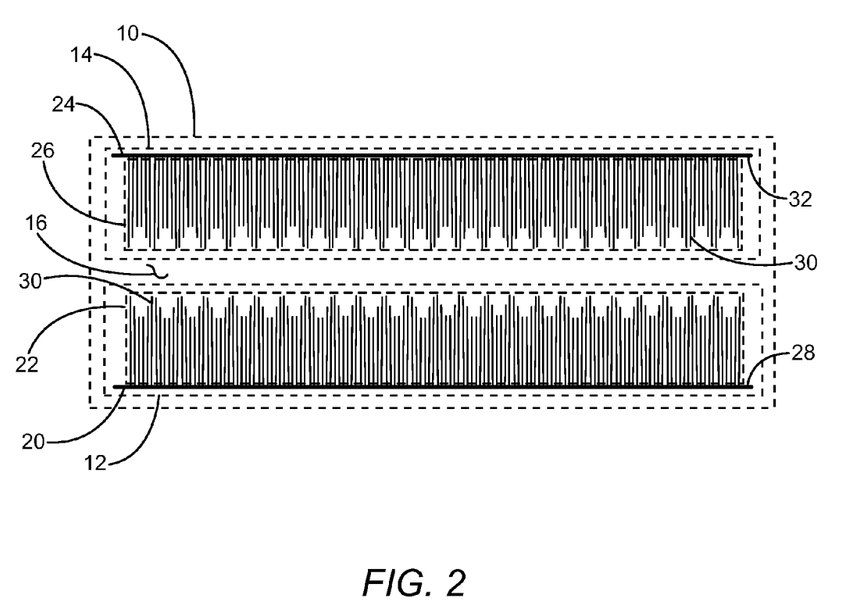
FIG. 2 shows a cross-section of the solid-state supercapacitor illustrated in FIG. 1 according to one embodiment of the solid-state supercapacitor.

FIG. 2 shows the cross-section 18 of the solid-state supercapacitor 10 illustrated in FIG. 1 according to one embodiment of the solid-state supercapacitor 10. The solid-state supercapacitor 10 includes the first electrode 12, the second electrode 14, and the solid-state ionogel structure 16 between the first electrode 12 and the second electrode 14. The solid-state ionogel structure 16 prevents direct electrical contact between the solid-state supercapacitor 10 and the second electrode 14. The first electrode 12 includes a first conductive supporting structure 20 and a first conductive nano-structure 22, which is attached to the first conductive supporting structure 20. As such, the first conductive supporting structure 20 is electrically connected to the first conductive nano-structure 22. The second electrode 14 includes a second conductive supporting structure 24 and a second conductive nano-structure 26, which is attached to the second conductive supporting structure 24. As such, the second conductive supporting structure 24 is electrically connected to the second conductive nano-structure 26.

The first conductive nano-structure 22 and the second conductive nano-structure 26 face one another as illustrated in FIG. 2. As such, a separating distance between the first conductive nano-structure 22 and the second conductive nano-structure 26 may be minimized, thereby maximizing a capacitance of the solid-state supercapacitor 10. Further, in one embodiment of the solid-state supercapacitor 10, the solid-state ionogel structure 16 substantially fills voids inside the first conductive nano-structure 22 and the second conductive nano-structure 26 thereby maximizing a capacitance of the solid-state supercapacitor 10.

The first conductive supporting structure 20 illustrated in FIG. 2 has a first surface 28. In one embodiment of the first conductive nano-structure 22, the first conductive nano-structure 22 is a first array of conductive quasi-one-dimensional nanostructures 30, such that each conductive quasi-one-dimensional nanostructure 30 extends from the first surface 28 of the first conductive nano-structure 22. The second conductive supporting structure 24 illustrated in FIG. 2 has a second surface 32. In one embodiment of the second conductive nano-structure 26, the second conductive nano-structure 26 is a second array of the conductive quasi-one-dimensional nanostructures 30, such that each conductive quasi-one-dimensional nanostructure 30 extends from the second surface 32 of the second conductive nano-structure 26. In this regard, the first surface 28 and the second surface 32 face one another as illustrated in FIG. 2.

In a first embodiment of the first conductive nano-structure 22, the first conductive nano-structure 22 includes nanotubes. In a second embodiment of the first conductive nano-structure 22, the first conductive nano-structure 22 includes carbon nanotubes. In a third embodiment of the first conductive nano-structure 22, the first conductive nano-structure 22 includes metallic nanowires. In a fourth embodiment of the first conductive nano-structure 22, the first conductive nano-structure 22 includes semiconductor nanowires. In a fifth embodiment of the first conductive nano-structure 22, the first conductive nano-structure 22 includes any or all of a combination of nanotubes, carbon nanotubes, metallic nanowires, and semiconductor nanowires.

In a first embodiment of the second conductive nano-structure 26, the second conductive nano-structure 26 includes nanotubes. In a second embodiment of the second conductive nano-structure 26, the second conductive nano-structure 26 includes carbon nanotubes. In a third embodiment of the second conductive nano-structure 26, the second conductive nano-structure 26 includes metallic nanowires. In a fourth embodiment of the second conductive nano-structure 26, the second conductive nano-structure 26 includes semiconductor nanowires. In a fifth embodiment of the second conductive nano-structure 26, the second conductive nano-structure 26 includes any or all of a combination of nanotubes, carbon nanotubes, metallic nanowires, and semiconductor nanowires.

In a first embodiment of the conductive quasi-one-dimensional nanostructure 30, the conductive quasi-one-dimensional nanostructure 30 is a nanotube. In a second embodiment of the conductive quasi-one-dimensional nanostructure 30, the conductive quasi-one-dimensional nanostructure 30 is a carbon nanotube. In a third embodiment of the conductive quasi-one-dimensional nanostructure 30, the conductive quasi-one-dimensional nanostructure 30 is a metallic nanowire. In a fourth embodiment of the conductive quasi-one-dimensional nanostructure 30, the conductive quasi-one-dimensional nanostructure 30 is a semiconductor nanowire.

In one embodiment of the first conductive supporting structure 20, the first conductive supporting structure 20 is a metallic sheet, which is about planar as shown in FIG. 2. In one embodiment of the second conductive supporting structure 24, the second conductive supporting structure 24 is a metallic sheet, which is about planar as shown in FIG. 2. In alternate embodiments of the first conductive supporting structure 20, the first conductive supporting structure 20 may be a non-metallic conductive sheet, may be a non-planar conductive sheet, may be a solid structure, the like, or any combination thereof. In alternate embodiments of the second conductive supporting structure 24, the second conductive supporting structure 24 may be a non-metallic conductive sheet, may be a non-planar conductive sheet, may be a solid structure, the like, or any combination thereof.

Figure 3:
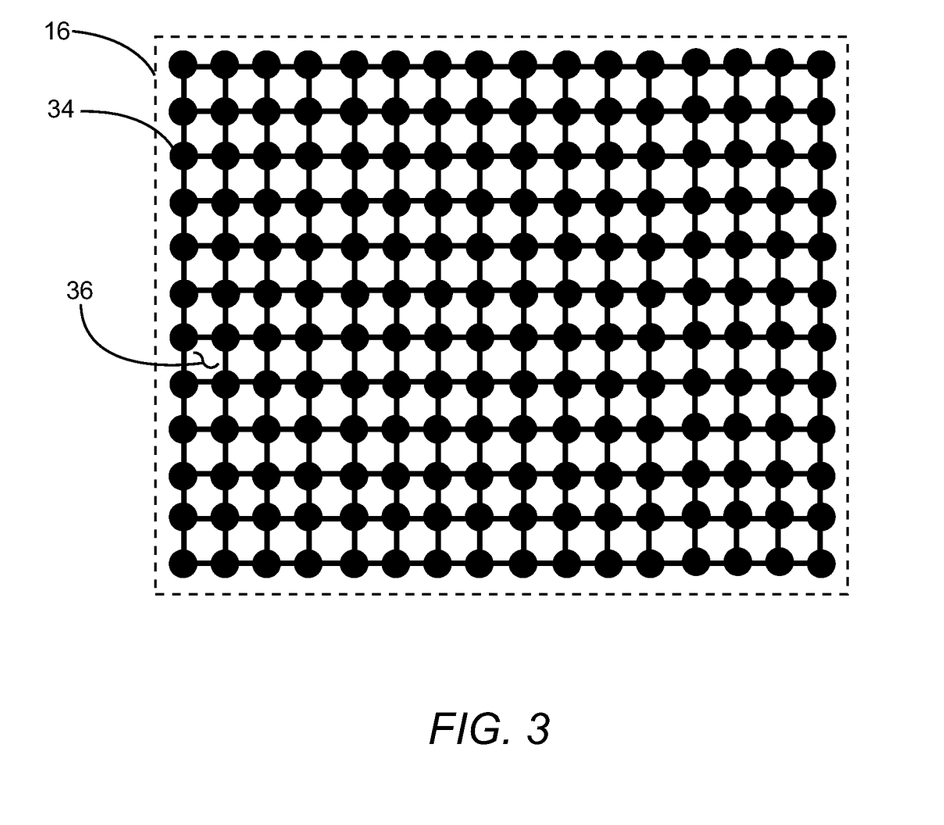
FIG. 3 shows details of a solid-state ionogel structure illustrated in FIG. 2 according to one embodiment of the solid-state ionogel structure.

FIG. 3 shows details of a portion of the solid-state ionogel structure 16 illustrated in FIG. 2 according to one embodiment of the solid-state ionogel structure 16. Ionogel is an encapsulated ionic liquid electrolyte. As such, the solid-state ionogel structure 16 includes a functionalized matrix 34 and an ionic liquid electrolyte 36, such that the ionic liquid electrolyte 36 is encapsulated into the functionalized matrix 34, thereby forming a solid structure. As such, the resulting supercapacitor is the solid-state supercapacitor 10 (FIG. 2). In this regard, in one embodiment of the solid-state ionogel structure 16, the solid-state ionogel structure 16 substantially fills voids inside, between, and surrounding the first electrode 12 (FIG. 2) and the second electrode 14 (FIG. 2), thereby providing effective ion paths between large surface areas of the first electrode 12 (FIG. 2) and the second electrode 14 (FIG. 2). Such ion paths provide high capacitance between the first electrode 12 (FIG. 2) and the second electrode 14 (FIG. 2).

In one embodiment of the functionalized matrix 34, the functionalized matrix 34 includes inorganic material. In one embodiment of the inorganic material, the inorganic material is silicon dioxide. Silicon dioxide may be a preferred material due to its physical, chemical, and electrical properties. In an alternate embodiment of the inorganic material, the inorganic material is germanium dioxide. Other embodiments of the functionalized matrix 34 may include other materials or combinations of other materials. In one embodiment of the ionic liquid electrolyte 36, the ionic liquid electrolyte 36 includes an organic salt. In one embodiment of the organic salt, the organic salt is an imidazolium based salt. In one embodiment of the imidazolium based salt, the imidazolium based salt is 1-Butyl-3-MethylimidazoliumTetrafluoroborate (BMIM $BF_4$). In an alternate embodiment of the imidazolium based salt, the imidazolium based salt is 1-Butyl-3-MethylimidazoliumTris(perfluoroethyl)trifluorophosphate (BMIM FAP). Other embodiments of the ionic liquid electrolyte 36 may include other materials or combinations of other materials.

The solid-state ionogel structure 16 has physical properties similar to other solid structures, which may provide mechanical strength and durability. As such, the solid-state supercapacitor 10 (FIG. 2) is mechanically durable. Further, the ionogel may have certain electrochemical properties similar to an ionic liquid electrolyte and other electrochemical properties that are different from an ionic liquid electrolyte. In this regard, the solid-state supercapacitor 10 (FIG. 2) may have a high maximum operating temperature, may have a high maximum operating voltage, and may be moisture resistant.

In one embodiment of the solid-state supercapacitor 10 (FIG. 2), the maximum operating temperature of the solid-state supercapacitor 10 (FIG. 2) is greater than or equal to about 200 degrees Celsius. In an alternate embodiment of the solid-state supercapacitor 10 (FIG. 2), the maximum operating temperature of the solid-state supercapacitor 10 (FIG. 2) is greater than or equal to about 225 degrees Celsius. In an additional embodiment of the solid-state supercapacitor 10 (FIG. 2), the maximum operating temperature of the solid-state supercapacitor 10 (FIG. 2) is greater than or equal to about 250 degrees Celsius.

In an exemplary embodiment of the solid-state supercapacitor 10, the maximum operating voltage of the solid-state supercapacitor 10 is greater than two volts. In an alternate exemplary embodiment of the solid-state supercapacitor 10, the maximum operating voltage of the solid-state supercapacitor 10 is greater than three volts. In an additional exemplary embodiment of the solid-state supercapacitor 10, the maximum operating voltage of the solid-state supercapacitor 10 is greater than four volts.

In one embodiment of the solid-state supercapacitor 10 (FIG. 2), the solid phase of the functionalized matrix 34 provides considerable moisture resistance for the solid-state ionogel structure 16. As such, in one embodiment of the solid-state supercapacitor 10 (FIG. 2), when the solid-state ionogel structure 16 is exposed to air having about 50 percent relative humidity, about standard temperature, and about standard pressure for one month, a capacitance change of the solid-state supercapacitor 10 (FIG. 2) is less than ten percent. In an alternate embodiment of the solid-state supercapacitor 10 (FIG. 2), when the solid-state ionogel structure 16 is exposed to air having about 50 percent relative humidity, about standard temperature, and about standard pressure for one month, the capacitance change of the solid-state supercapacitor 10 (FIG. 2) is less than five percent.

Since the solid-state supercapacitor 10 (FIG. 2) may have high capacitance and since the solid-state supercapacitor 10 (FIG. 2) may have a high maximum operating voltage, the solid-state supercapacitor 10 (FIG. 2) may have high specific energy. As such, in an exemplary embodiment of the solid-state supercapacitor 10 (FIG. 2), a specific energy of the solid-state supercapacitor 10 (FIG. 2) is greater than 30 joules per gram. In an alternate exemplary embodiment of the solid-state supercapacitor 10 (FIG. 2), the specific energy of the solid-state supercapacitor 10 (FIG. 2) is greater than 60 joules per gram. In an additional exemplary embodiment of the solid-state supercapacitor 10 (FIG. 2), the specific energy of the solid-state supercapacitor 10 (FIG. 2) is greater than 90 joules per gram.

Figure 4:
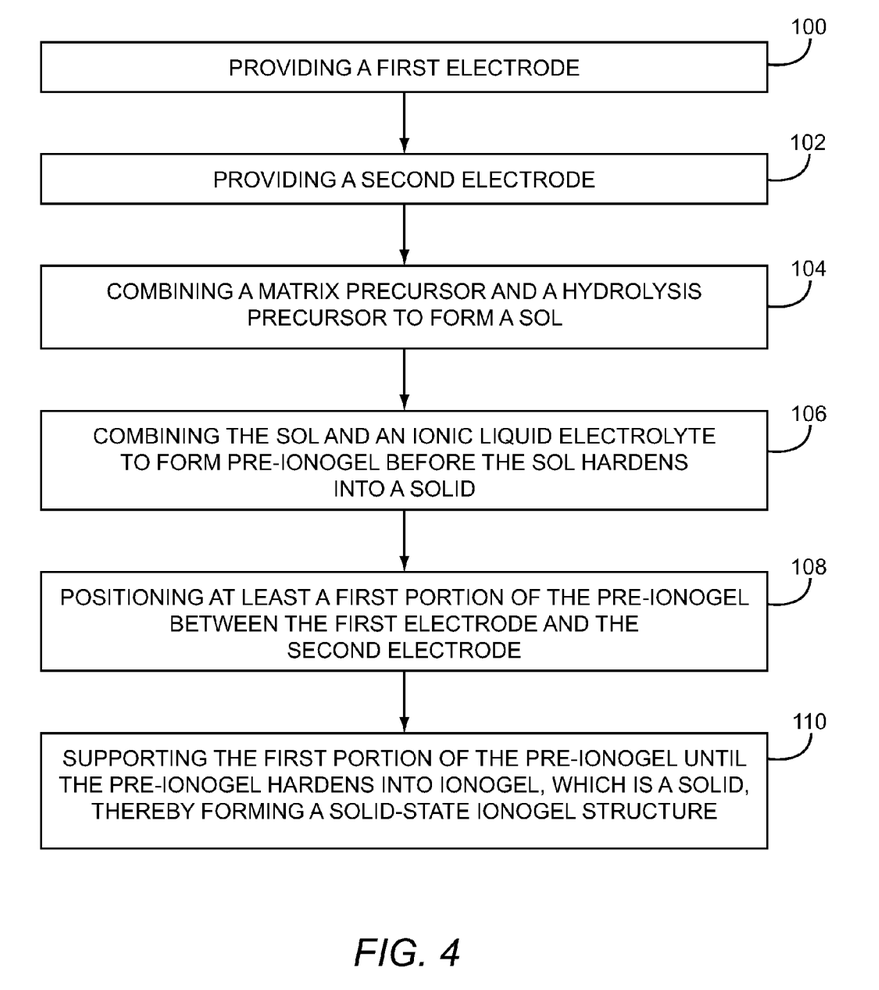
FIG. 4 illustrates a process for fabricating the solid-state supercapacitor illustrated in FIG. 2 according to one embodiment of the process for fabricating the solid-state supercapacitor.

FIG. 4 illustrates a process for fabricating the solid-state supercapacitor 10 illustrated in FIG. 2 according to one embodiment of the process for fabricating the solid-state supercapacitor 10. The process begins by providing the first electrode 12 (FIG. 2) (Step 100) and providing the second electrode 14 (FIG. 2) (Step 102). The process continues by combining a matrix precursor and a hydrolysis precursor to form a sol (Step 104). The process further continues by combining the sol and the ionic liquid electrolyte 36 (FIG. 3) to form pre-ionogel before the sol hardens into a solid (Step 106). Pre-ionogel is ionogel that has not yet hardened into a solid. The process progresses by positioning at least a first portion of the pre-ionogel between the first electrode 12 (FIG. 2) and the second electrode 14 (FIG. 2) (Step 108). The process completes by supporting the first portion of the pre-ionogel until the pre-ionogel hardens into ionogel, which is a solid, thereby forming the solid-state ionogel structure 16 (FIG. 2) (Step 110).

In one embodiment of the matrix precursor, the matrix precursor is a silicon dioxide matrix precursor. In one embodiment of the silicon dioxide matrix precursor, the silicon dioxide matrix precursor includes at least one selected from a group consisting of Tetramethylorthosilicate, Tetraethylorthosilicate, Trimethoxyvinylsilane, and Triethoxyvinylsilane. In an alternate embodiment of the silicon dioxide matrix precursor, the silicon dioxide matrix precursor includes Tetramethylorthosilicate and Triethoxyvinylsilane. In an alternate embodiment of the matrix precursor, the matrix precursor is a germanium dioxide matrix precursor. In one embodiment of the hydrolysis precursor, the hydrolysis precursor is an acid. In one embodiment of the hydrolysis precursor, the hydrolysis precursor is formic acid.

In an exemplary embodiment of the process, the matrix precursor includes about equal parts of Triethoxyvinylsilane and Tetramethylorthosilicate, and the hydrolysis precursor is formic acid. A volume ratio of about 2:2:5 of the Triethoxyvinylsilane, the Tetramethylorthosilicate, and the formic acid are mixed together at about 40 degrees Celsius to form the Sol (Step 104). The Sol and the ionic liquid electrolyte 36 (FIG. 3) are quickly combined after 20 minutes at room temperature (Step 106), such that the resulting mixture provides a concentration of about 71 percent, by volume, of the ionic liquid electrolyte 36 (FIG. 3).

Figure 5:
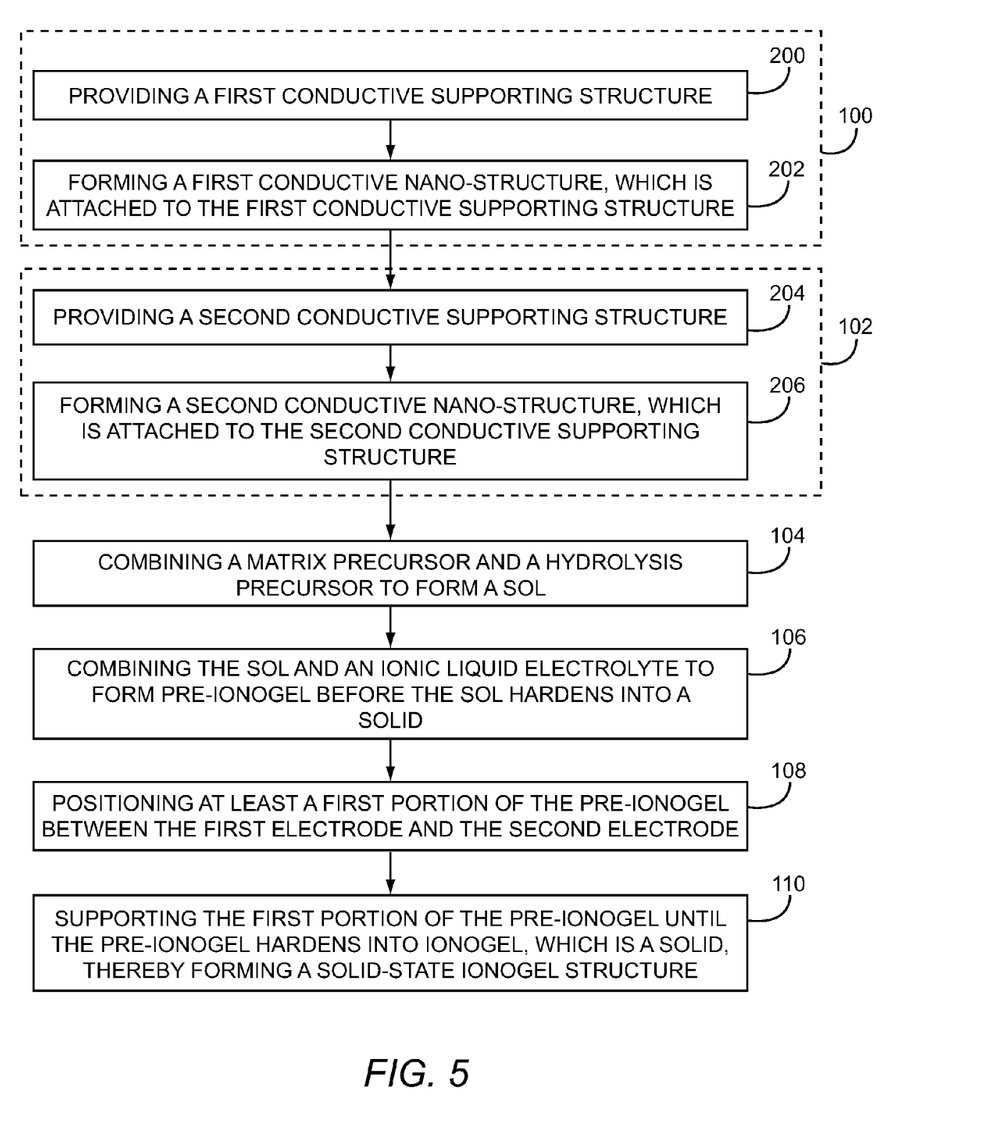
FIG. 5 illustrates a process for fabricating the solid-state supercapacitor illustrated in FIG. 2 according to an alternate embodiment of the process for fabricating the solid-state supercapacitor.

FIG. 5 illustrates a process for fabricating the solid-state supercapacitor 10 illustrated in FIG. 2 according to an alternate embodiment of the process for fabricating the solid-state supercapacitor 10. The process illustrated in FIG. 5 is similar to the process illustrated in FIG. 4. However, Step 100 further includes providing the first conductive supporting structure 20 (FIG. 2) (Step 200) and forming the first conductive nano-structure 22 (FIG. 2), which is attached to the first conductive supporting structure 20 (FIG. 2) (Step 202). Step 102 further includes providing the second conductive supporting structure 24 (FIG. 2) (Step 204) and forming the second conductive nano-structure 26 (FIG. 2), which is attached to the second conductive supporting structure 24 (FIG. 2) (Step 206). Steps 104 through 110 are repeated from FIG. 4.

Figure 6:
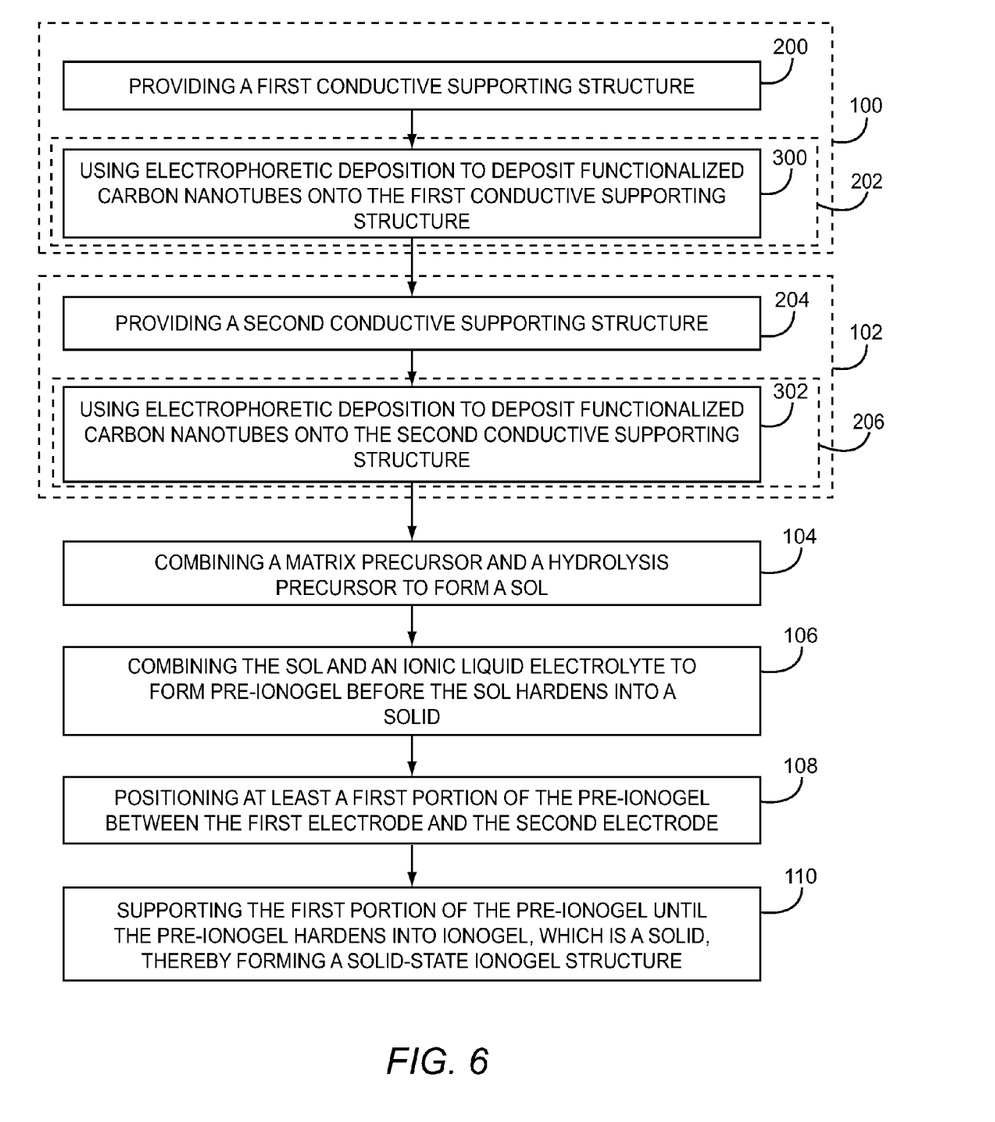
FIG. 6 illustrates a process for fabricating the solid-state supercapacitor illustrated in FIG. 2 according to an additional embodiment of the process for fabricating the solid-state supercapacitor.

FIG. 6 illustrates a process for fabricating the solid-state supercapacitor 10 illustrated in FIG. 2 according to an additional embodiment of the process for fabricating the solid-state supercapacitor 10. The process illustrated in FIG. 6 is similar to the process illustrated in FIG. 5. However, Step 202 further includes using electrophoretic deposition to deposit functionalized carbon nanotubes onto the first conductive supporting structure 20 (FIG. 2) (Step 300). Step 206 further includes using electrophoretic deposition to deposit functionalized carbon nanotubes onto the second conductive supporting structure 24 (FIG. 2) (Step 302). Steps 104 through 110, 200, and 204 are repeated from FIG. 5.

In one embodiment of the process, after the completion of Steps 300 and 302, the first electrode 12 (FIG. 2) and the second electrode 14 (FIG. 2) are heated in a hydrogen/nitrogen gaseous environment for several hours to remove residual solvent, adsorbed molecular oxygen, or both. In a first exemplary embodiment of the process, a temperature of the gaseous environment is greater than or equal to about 200 degrees Celsius. In a second exemplary embodiment of the process, a temperature of the gaseous environment is greater than or equal to about 250 degrees Celsius. In a third exemplary embodiment of the process, a temperature of the gaseous environment is greater than or equal to about 300 degrees Celsius. In a fourth exemplary embodiment of the process, a temperature of the gaseous environment is greater than or equal to about 400 degrees Celsius. In a fifth exemplary embodiment of the process, a temperature of the gaseous environment is equal to about 500 degrees Celsius.

Figure 7:
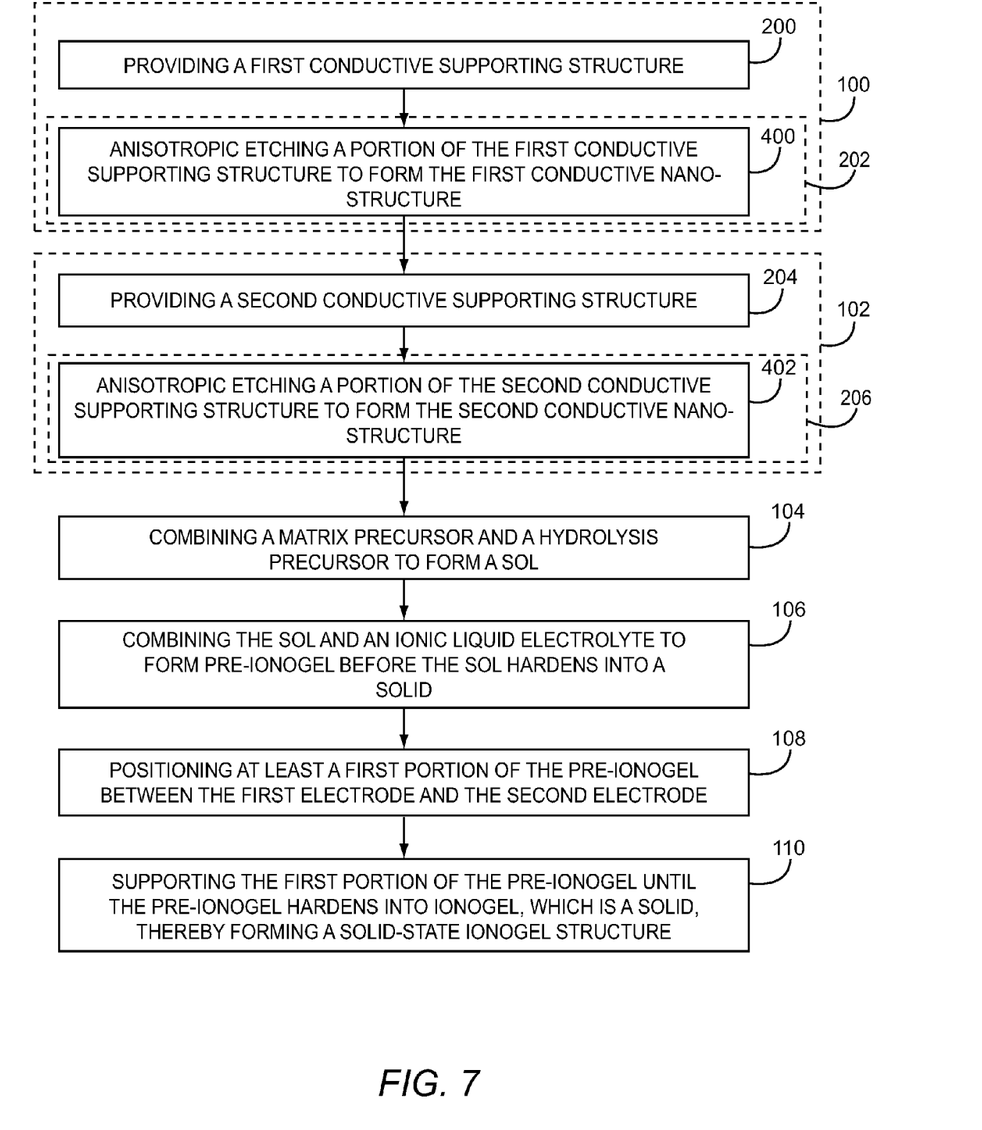
FIG. 7 illustrates a process for fabricating the solid-state supercapacitor illustrated in FIG. 2 according to another embodiment of the process for fabricating the solid-state supercapacitor.

FIG. 7 illustrates a process for fabricating the solid-state supercapacitor 10 illustrated in FIG. 2 according to another embodiment of the process for fabricating the solid-state supercapacitor 10. The process illustrated in FIG. 7 is similar to the process illustrated in FIG. 5. However, Step 202 further includes anisotropic etching a portion of the first conductive supporting structure 20 (FIG. 2) to form the first conductive nano-structure 22 (FIG. 2) (Step 400). Step 206 further includes anisotropic etching a portion of the second conductive supporting structure 24 (FIG. 2) to form the second conductive nano-structure 26 (FIG. 2) (Step 402). Steps 104 through 110, 200, and 204 are repeated from FIG. 5.

Figure 8:
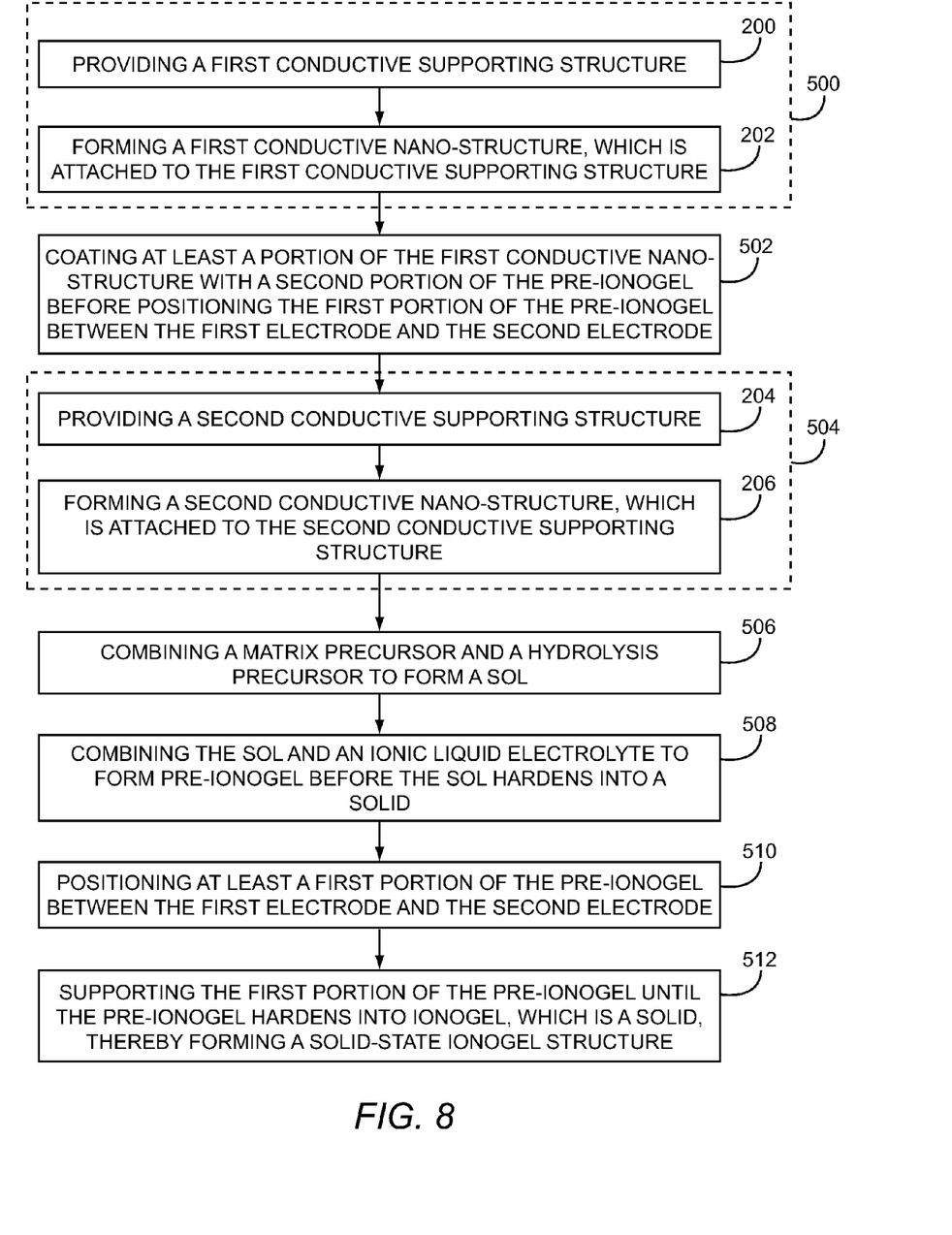
FIG. 8 illustrates a process for fabricating the solid-state supercapacitor illustrated in FIG. 2 according to a further embodiment of the process for fabricating the solid-state supercapacitor.

FIG. 8 illustrates a process for fabricating the solid-state supercapacitor 10 illustrated in FIG. 2 according to a further embodiment of the process for fabricating the solid-state supercapacitor 10. The process illustrated in FIG. 8 is similar to the process illustrated in FIG. 5. Step 100 in FIG. 5 is repeated as Step 500 in FIG. 8. The process continues by coating at least a portion of the first conductive nano-structure 22 (FIG. 2) with a second portion of the pre-ionogel before positioning the first portion of the pre-ionogel between the first electrode 12 (FIG. 2) and the second electrode 14 (FIG. 2) (Step 502). Step 102 in FIG. 5 is repeated as Step 504 in FIG. 8. Step 104 in FIG. 5 is repeated as Step 506 in FIG. 8. Step 106 in FIG. 5 is repeated as Step 508 in FIG. 8. Step 108 in FIG. 5 is repeated as Step 510 in FIG. 8. Step 110 in FIG. 5 is repeated as Step 512 in FIG. 8. In one embodiment of Step 502, the coating at least the portion of the first conductive nano-structure 22 (FIG. 2) with the second portion of the pre-ionogel includes spin-coating at least the portion of the first conductive nano-structure 22 (FIG. 2) with the second portion of the pre-ionogel.

In one embodiment of the process, the second portion of the pre-ionogel is prepared from a batch of pre-ionogel that is different from the batch of pre-ionogel that is prepared in Steps 506 and 508. In an alternate embodiment of the process, the first portion and the second portion of the ionogel are prepared from a common batch of ionogel. As such, Steps 506 and 508 must occur before Step 502. In another embodiment of the process, Step 204 or both Steps 204 and 206 occur before Step 502. In a further embodiment of the process, Step 510 occurs after Step 502, such that pre-ionogel is added to the top of the previously coated first conductive nano-structure 22 (FIG. 2). Then, the second electrode 14 (FIG. 2) is placed on top of the previously coated first conductive nano-structure 22 (FIG. 2). After a first period of time at room temperature, the assembly may be subjected to a first heat treatment at a first heat treatment temperature for a first heat treatment duration. After the first heat treatment, the assembly may be subjected to a second heat treatment at a second heat treatment temperature for a second heat treatment duration.

In one embodiment of the process, the first heat treatment temperature is equal to about 40 degrees Celsius, the first heat treatment duration is equal to between about 12 hours and about 72 hours, the second heat treatment temperature increases from about 40 degrees Celsius to about 100 degrees Celsius during the second heat treatment, and the second heat treatment duration is equal to about 12 hours. In one embodiment of the process, during the second heat treatment, the assembly is subjected to a vacuum.

Figure 9:
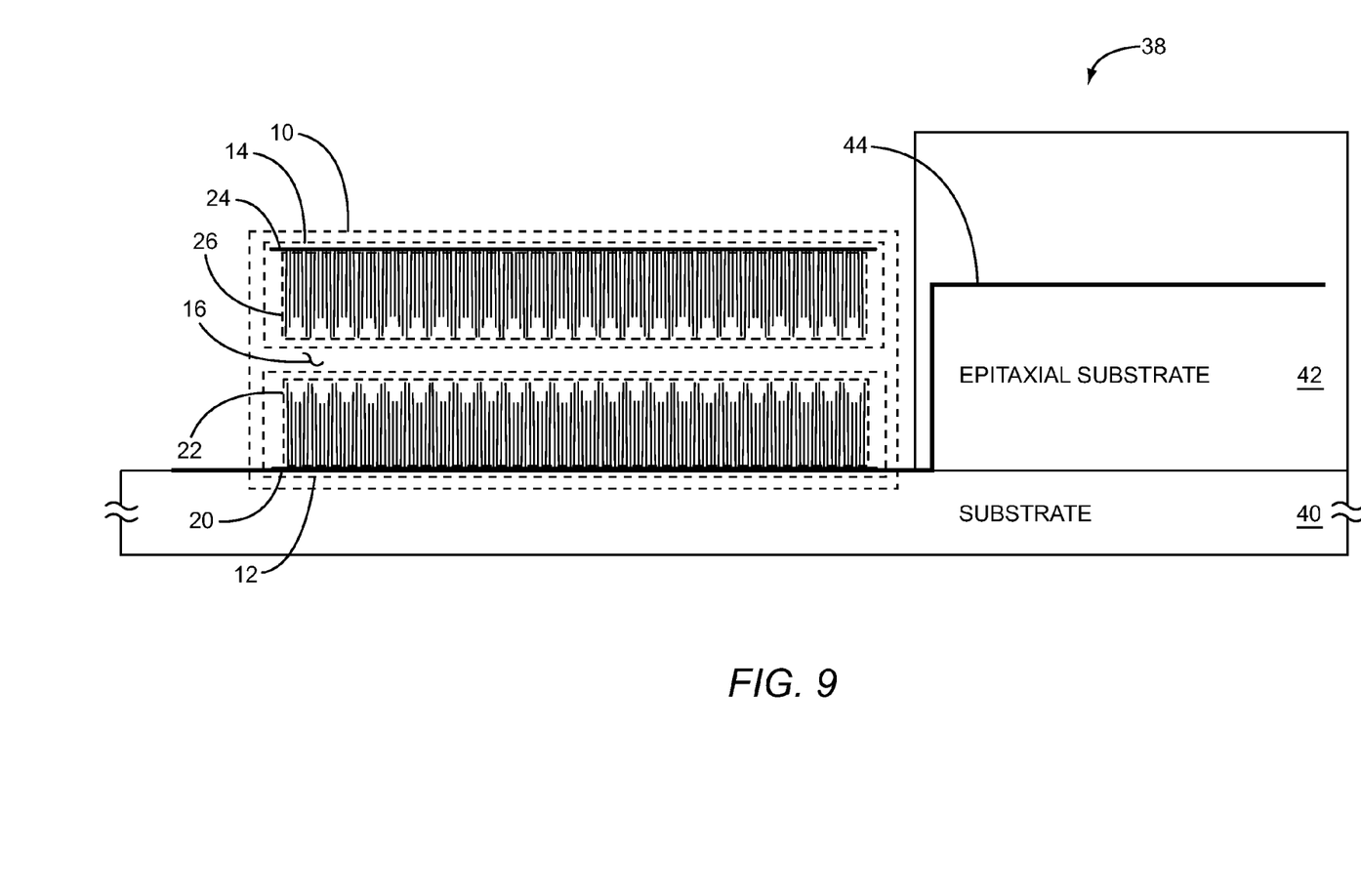
FIG. 9 shows a semiconductor die according to one embodiment of the semiconductor die.

FIG. 9 shows a semiconductor die 38 according to one embodiment of the semiconductor die 38. The semiconductor die 38 includes a substrate 40, an epitaxial structure 42 over the substrate 40, the solid-state supercapacitor 10 over the substrate 40, and a metallization layer 44. The solid-state supercapacitor 10 illustrated in FIG. 9 is similar to the solid-state supercapacitor 10 illustrated in FIG. 2.

Since the solid-state ionogel structure 16 may provide moisture resistance for the solid-state supercapacitor 10 and since a typical micro-electronics manufacturing environment exposes devices under fabrication to ambient air, which has moisture, the solid-state supercapacitor 10 may be integrated into a typical micro-electronics fabrication environment without being damaged by the moisture in the ambient air. As such, the solid-state supercapacitor 10 may be integrated into the semiconductor die 38, thereby reducing manufacturing costs, product size, and the like. In one embodiment of the semiconductor die 38, the substrate 40 includes silicon. In an alternate embodiment of the semiconductor die 38, the epitaxial structure 42 includes silicon. In an additional embodiment of the semiconductor die 38, both the substrate 40 and the epitaxial structure 42 include silicon.

In the semiconductor die 38 illustrated in FIG. 9, a first portion of the metallization layer 44 is on the substrate 40 and a second portion of the metallization layer 44 is in the epitaxial structure 42. The solid-state supercapacitor 10 uses the first portion of the metallization layer 44 to provide the first conductive supporting structure 20 of the solid-state supercapacitor 10. In this regard, the epitaxial structure 42 and the solid-state supercapacitor 10 share the metallization layer 44. Since the metallization layer 44, as illustrated, is continuous between the first conductive supporting structure 20 and the epitaxial structure 42, the metallization layer 44 provides electrical connectivity between the solid-state supercapacitor 10 and the epitaxial structure 42. In alternate embodiments of the metallization layer 44, the metallization layer 44 may not be continuous. Therefore, the first portion of the metallization layer 44 may not be connected to the second portion of the metallization layer 44.

In alternate embodiments of the semiconductor die 38, the solid-state supercapacitor 10 may be on the substrate 40, the epitaxial structure 42 may be on the substrate 40, or both. In an additional embodiment of the semiconductor die 38, the solid-state supercapacitor 10 may be over or on the epitaxial structure 42. In another embodiment of the semiconductor die 38, the epitaxial structure 42 may be over or on the solid-state supercapacitor 10.

Figure 10:
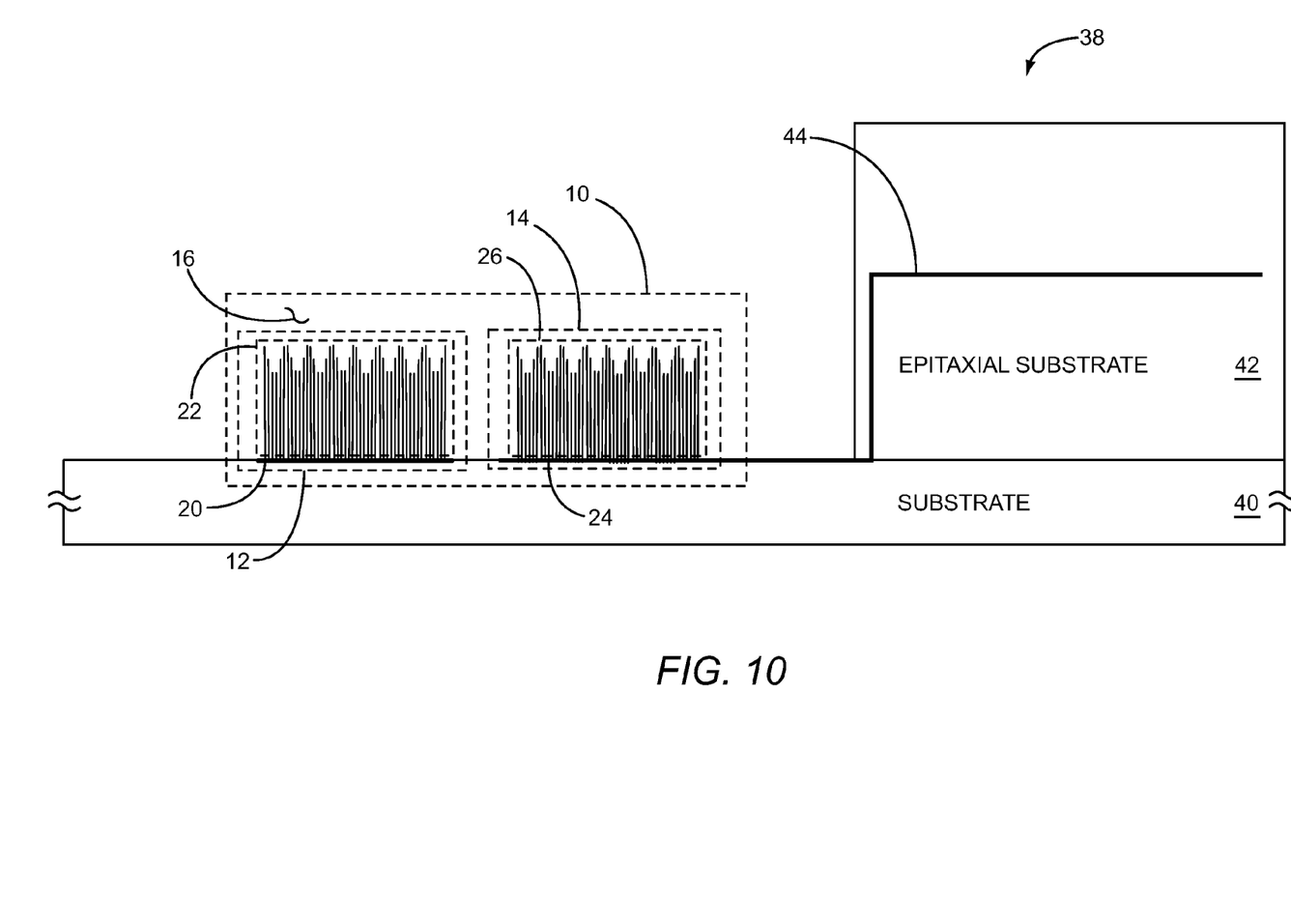
FIG. 10 shows the semiconductor die according to an alternate embodiment of the semiconductor die.

FIG. 10 shows the semiconductor die 38 according to a further embodiment of the semiconductor die 38. The semiconductor die 38 illustrated in FIG. 10 is similar to the semiconductor die 38 illustrated in FIG. 9, except in the semiconductor die 38 illustrated in FIG. 9, the solid-state supercapacitor 10 uses a side-by-side architecture instead of a stacked architecture. Specifically, the first electrode 12 and the second electrode 14 are located side-by-side with the solid-state ionogel structure 16 between the first electrode 12 and the second electrode 14 as previously presented. In one embodiment of the semiconductor die 38, the first electrode 12 includes a first portion of the metallization layer 44 and the second electrode 14 includes a second portion of the metallization layer 44. The side-by-side architecture may simplify fabrication of the solid-state supercapacitor 10. In one embodiment of the solid-state supercapacitor 10, the first electrode 12 and the second electrode 14 are about co-planar.

Those skilled in the art will recognize improvements and modifications to the embodiments of the present disclosure. All such improvements and modifications are considered within the scope of the concepts disclosed herein and the claims that follow.

What is claimed is:

1. A solid-state supercapacitor comprising:
   a first electrode comprising a first conductive supporting structure and a first array of conductive quasi-one-dimensional structures that extend from the first conductive supporting structure;
   a second electrode comprising a second conductive supporting structure and a second array of conductive quasi-one-dimensional structures that extend from the second conductive supporting structure; and
   a solid-state ionogel structure disposed between the first electrode and the second electrode, wherein:
   the solid-state ionogel structure prevents direct electrical contact between the first electrode and the second electrode; and
   the solid-state ionogel structure substantially fills voids within and between the first array of conductive quasi-one-dimensional structures and the second array of conductive quasi-one-dimensional structures.

2. The solid-state supercapacitor of claim 1 wherein when the solid-state ionogel structure is exposed to air having about 50 percent relative humidity, about standard temperature, and about standard pressure for one month, a capacitance change of the solid-state supercapacitor is less than ten percent.

3. The solid-state supercapacitor of claim 1 wherein a maximum operating temperature of the solid-state supercapacitor is greater than 250 degrees Celsius.

4. The solid-state supercapacitor of claim 1 wherein a maximum operating voltage of the solid-state supercapacitor is greater than two volts.

5. The solid-state supercapacitor of claim 1 wherein a specific energy of the solid-state supercapacitor is greater than 30 joules per gram.

6. The solid-state supercapacitor of claim 1 wherein the solid-state ionogel structure comprises a functionalized matrix.

7. The solid-state supercapacitor of claim 6 wherein the functionalized matrix comprises inorganic material.

8. The solid-state supercapacitor of claim 7 wherein the inorganic material is silicon dioxide.

9. The solid-state supercapacitor of claim 6 wherein the solid-state ionogel structure further comprises an organic salt.

10. The solid-state supercapacitor of claim 9 wherein the organic salt is an imidazolium based salt.

11. The solid-state supercapacitor of claim 10 wherein the imidazolium based salt is 1-Butyl-3-MethylimidazoliumTetrafluoroborate (BMIM $BF_4$).

12. The solid-state supercapacitor of claim 1 wherein the first conductive supporting structure is a metallic sheet, which is about planar and the second conductive supporting structure is a metallic sheet, which is about planar.

13. The solid-state supercapacitor of claim 1 wherein:
   each of the first array of conductive quasi-one-dimensional structures extends from a surface of the first conductive supporting structure; and
   each of the second array of conductive quasi-one-dimensional structures extends from a surface of the second conductive supporting structure.

14. The solid-state supercapacitor of claim 1 wherein the first array of conductive quasi-one-dimensional structures comprises carbon nanotubes and the second array of conductive quasi-one-dimensional structures comprises carbon nanotubes.

15. The solid-state supercapacitor of claim 1 wherein the solid-state supercapacitor is formed on a semiconductor die comprising:
a substrate; and
an epitaxial structure over the substrate, wherein the solid-state supercapacitor resides over the substrate.

16. The solid-state supercapacitor of claim 15 wherein at least one of the substrate and the epitaxial structure comprises silicon.

17. The solid-state supercapacitor of claim 15 wherein the epitaxial structure and the solid-state supercapacitor share a metallization layer.

18. The solid-state supercapacitor of claim 15 wherein the first electrode comprises a first portion of a metallization layer.

19. The solid-state supercapacitor of claim 18 wherein the second electrode comprises a second portion of the metallization layer.

* * * * *